United States Patent [19]

Lee

[11] Patent Number: 5,751,183

[45] Date of Patent: May 12, 1998

[54] BIPOLAR TRANSISTOR CIRCUIT HAVING A FREE COLLECTOR

[75] Inventor: Sang-O Lee, Seoul, Rep. of Korea

[73] Assignee: Samsung Electronics Co., Ltd., Suwon, Rep. of Korea

[21] Appl. No.: 730,879

[22] Filed: Oct. 17, 1996

[30] Foreign Application Priority Data

Oct. 18, 1995 [KR] Rep. of Korea ............. 95-36001

[51] Int. Cl.$^6$ .................. G05F 1/10; H03K 17/60
[52] U.S. Cl. .................. 327/542; 327/432; 327/538
[58] Field of Search ................. 327/63, 87, 432, 327/538, 542

[56] References Cited

U.S. PATENT DOCUMENTS

| | | | |
|---|---|---|---|
| 4,427,903 | 1/1984 | Sugimoto | 327/103 |
| 4,675,561 | 6/1987 | Bowers | 327/382 |
| 4,714,872 | 12/1987 | Traa | 323/314 |
| 4,885,477 | 12/1989 | Bird et al. | 327/52 |
| 5,081,379 | 1/1992 | Korteling | 327/50 |
| 5,220,207 | 6/1993 | Kovalcik et al. | 327/63 |

*Primary Examiner*—David C. Nelms
*Assistant Examiner*—Hoai V. Ho
*Attorney, Agent, or Firm*—Jones & Volentine, L.L.P.

[57] ABSTRACT

The present invention relates to a bipolar transistor circuit having a free collector embodied on the chip manufactured by a CMOS manufacturing method. The bipolar transmission circuit comprises first and second bipolar transistors having common collectors and common bases, the common collectors being applied with a first voltage; a transconductor, connected to emitters of the first and second bipolar transistors, for detecting and amplifying an error voltage between first and second emitter voltages received respectively from the emitters of the first and second bipolar transistors; a first MOS transistor, for generating a drain current corresponding to a gate voltage received from the transconductor, the gate of the first MOS transistor being connected to an output of the transconductor, the drain of the first MOS transistor being connected to the emitter of the second bipolar transistor, and the source of the first MOS transistor being connected to a second voltage; and a second MOS transistor for generating a drain current proportional to the drain current of the first MOS transistor, the gate of the second transistor being connected to the output of the transconductor and the source of the second MOS transistor being connected to the second voltage. This bipolar transistor circuit solves the problem of parasitic capacitance without significantly increasing the complexity of the construction of the CMOS device.

9 Claims, 3 Drawing Sheets

BIPOLAR TRANSISTOR CIRCUIT HAVING A FREE COLLECTOR

BACKGROUND OF THE INVENTION

The present invention relates to a bipolar transistor circuit. More particularly the present invention relates to a bipolar transistor circuit having a free collector on a chip manufactured by a complementary metal-oxide-semiconductor (CMOS) manufacturing process.

A conventional bipolar transistor circuit is described below with reference to the accompanying drawings.

First, a conventional vertical bipolar transistor is described below with reference to FIGS. 1 and 2.

As shown in FIG. 1, a conventional vertical bipolar transistor comprises an n substrate 53, a p well 52 formed by diffusing p type impurities into the surface of the n substrate 53, and an n+ region 51 formed by diffusing high density n type impurities into the surface of the p well 52. Here, a voltage $V_{DD}$ is supplied to the surface of the n substrate 53; a base electrode B is formed on the surface of the p well 52; and an emitter electrode E is formed on the surface of the n+ region 51.

FIG. 2 illustrates the equivalent circuit of the vertical bipolar transistor shown in FIG. 1. As shown in FIG. 2, the collector of the bipolar transistor is connected to the voltage supply $V_{DD}$.

In conventional chip manufacturing a junction isolation is used to isolate elements created during a CMOS manufacturing process. In such a junction isolation, the substrate is generally connected to the power supply. Accordingly, the use of the collector of a bipolar transistor on such a chip is quite limited because the collector is always fixed to the substrate and the supply voltage is often fixed to the substrate.

A lateral bipolar transistor having a free collector has been proposed to overcome this problem. FIGS. 3 and 4 illustrates a conventional lateral bipolar transistor having such a free collector. A more detailed description of this kind of lateral bipolar transistor appears in "The Design of High Performance Analog circuits on Digital CMOS chips," E. A. Vittoz, IEEE JSSC, Vol. sc-20, No. 3, June 1985.

As shown in FIG. 3, the conventional lateral bipolar transistor comprises an n substrate 73, a p well 72 formed by diffusing p type impurities into the surface of the n substrate 73, and two n+ regions 70 and 71 formed by diffusing high density n type impurities into the surface of the p well 72.

Here, a voltage $V_{DD}$ is supplied to the surface of the n substrate 73; a MOS type gate and a base B are formed on the surface of the p well 72; an emitter E is formed on the surface of the first n+ region 71; and a collector C is formed on the surface of the second n+ region 70.

The lateral bipolar transistor is formed using the source of the MOS transistor as the emitter E, the drain of the MOS transistor as the collector C, and the p well as the base B. The gate G is used to control a channel stop. The voltage $V_{DD}$ applied to the n substrate 73 is used for isolation.

FIG. 4 illustrates an equivalent transistor of the lateral bipolar transistor having a free collector shown in FIG. 3. As shown in FIG. 4, along with the original lateral bipolar transistor formed by the source-well-drain in the lateral bipolar transistor there is a parasitic vertical bipolar transistor formed by the source-well-substrate.

In this design, the original lateral bipolar transistor and a parasitic vertical bipolar transistor share the collector current. The current amount that flows to the parasitic transistor depends on the manufacturing steps.

This system has certain disadvantages, however. For example, there is a loss of a current gain caused by the parasitic current. Also, it is hard to estimate the collector current amount for the lateral bipolar transistor. In addition, circuits need to reduce the parasitic current because it depends more on the manufacturing steps.

SUMMARY OF THE INVENTION

In view of the above, it is an object of the present invention to provide a bipolar transistor circuit having a free collector by appending the additional circuits to overcome the conventional technical problem.

To achieve the above-mentioned object, according to a preferred embodiment of the present invention, the first and second bipolar transistors have a common base and a common collector, and a first voltage is applied to their common collector. A transconductor detects and amplifies the error voltage between the inputted voltages of each emitter of the first and second bipolar transistors.

The first MOS transistor generates a drain current corresponding to a gate voltage received from the transconductor. The gate of the first MOS transistor is connected to an output of the transconductor; the drain of the first MOS transistor is connected to the emitter of the second bipolar transistor; and the source of the first MOS transistor is connected to a second voltage. The second MOS transistor generates a drain current proportional to the drain current of the first MOS transistor. The second MOS transistor achieves this since it is connected to the first MOS transistor in a mirror relation.

In such construction, the common base of the first and second bipolar transistors becomes a base of the whole transistor circuit, the emitter of the first bipolar transistor becomes a emitter of the whole transistor circuit, and the drain of the second MOS transistor becomes a collector of the whole transistor circuit.

Also, the transconductor, the first MOS transistor and the second bipolar transistor form a negative feedback loop, and the error voltage of the transconductor will reduce to zero as the gain of the feedback loop increases. The gain of the feedback loop is determined by the bias currents of both the bipolar transistors, the gain of the transconductor and W/L of the first MOS transistor (where W is a channel width, L is a channel length).

DETAILED DESCRIPTION OF THE PREFERRED EMBODIMENTS

A preferred embodiment of the present invention is described below with reference to the accompanying drawings.

Figure 1:
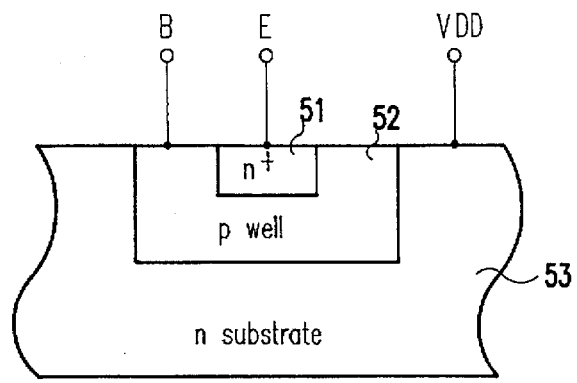
FIG. 1 is a cross-sectional view of a conventional vertical bipolar transistor.
Figure 3:
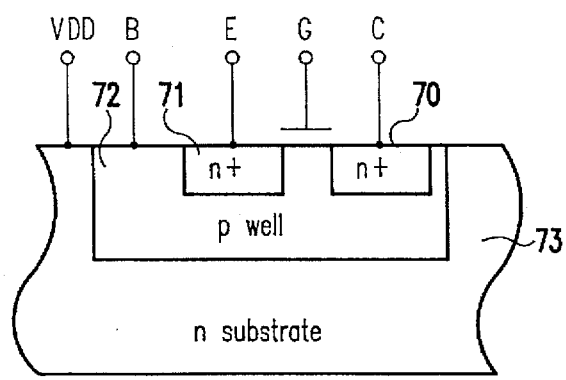
FIG. 3 is a cross-sectional view of a conventional lateral bipolar transistor.
Figure 2:
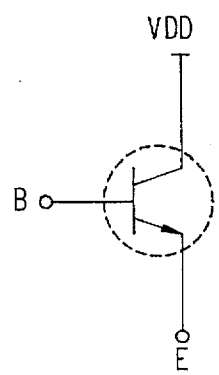
FIG. 2 is a circuit diagram showing a circuit equivalent to the transistor shown in FIG. 1.
Figure 4:
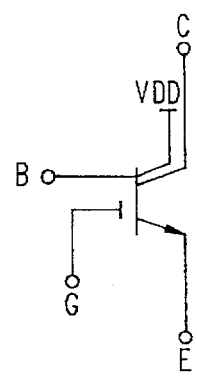
FIG. 4 is a circuit diagram showing a circuit equivalent to the transistor shown in FIG. 3.
Figure 5:
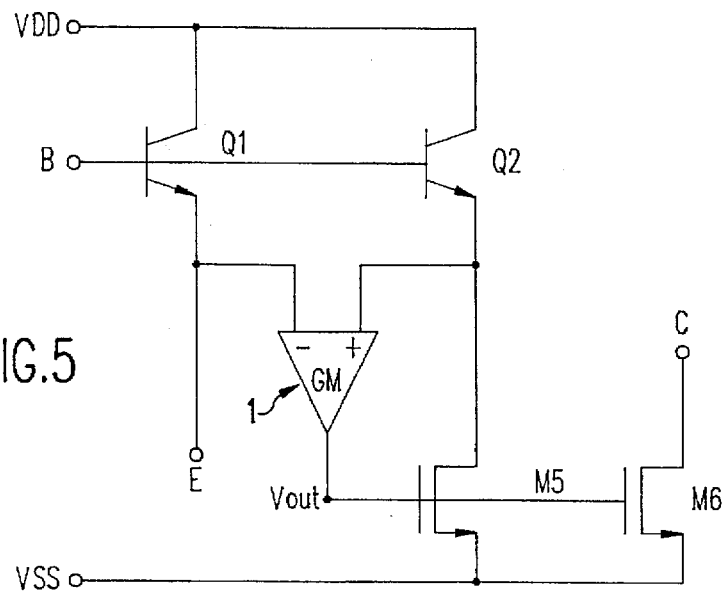
FIG. 5 is a detailed circuit diagram of a bipolar transistor circuit having a free collector in accordance with a preferred embodiment of the present invention.

FIG. 5 shows a bipolar transistor circuit having a free collector in accordance with a preferred embodiment of the present invention. The preferred embodiment of the bipolar transistor circuit comprises a first bipolar transistor $Q_1$, a second bipolar transistor $Q_2$, a transconductor 1, a first MOS transistor $M_5$, and a second MOS transistor $M_6$. The first and second bipolar transistors $Q_1$ and $Q_2$ have a common collector, applied with a first voltage $V_{DD}$, and a common base. The transconductor 1 has its negative input terminal connected to the emitter of the first bipolar transistor $Q_1$, and its positive input terminal connected to the emitter of the second bipolar transistor $Q_2$. The first MOS transistor $M_5$ has its gate connected to the output terminal of the transconductor 1, its drain connected to the emitter of the bipolar transistor $Q_2$, and its source connected to a second voltage $V_{SS}$. The second MOS transistor $M_6$ has its gate connected to the gate of the first MOS transistor $M_5$ and its source connected to the second voltage $V_{SS}$.

In this embodiment, the bipolar transistors $Q_1$ and $Q_2$ are preferably vertical npn type transistors and the MOS transistors $M_5$ and $M_6$ are preferably n-type MOS (NMOS) transistors.

Figure 6:
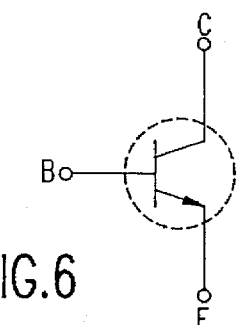
FIG. 6 is a circuit diagram showing a circuit equivalent to the bipolar transistor circuit shown in FIG. 5.

FIG. 6 is a circuit diagram showing a circuit equivalent to the bipolar transistor circuit shown in FIG. 5. The base B shown in FIG. 6 is the common base B of the first and second bipolar transistors $Q_1$ and $Q_2$ shown in FIG. 5. The emitter E shown in FIG. 6 is the emitter E of the first bipolar transistor $Q_1$ shown in FIG. 5. The collector C shown in FIG. 6 is the drain of the second MOS transistor $M_6$ shown in FIG. 5.

The preferred embodiment of the bipolar transistor circuit with a free collector operates as follows. The first and second bipolar transistors $Q_1$ and $Q_2$ perform the operation of a general transistor corresponding to their common base B current. The emitter voltages of the transistors $Q_1$ and $Q_2$ are then applied respectively to the negative and positive input terminals of the transconductor 1.

The transconductor 1 detects the error voltage between these two emitter voltages and converts the error voltage into a current. The converted current is then output across an output resistor (not shown in FIG. 5) to provide an amplified error voltage $V_{out}$. This amplified output voltage is then provided to the gate of the first MOS transistor $M_5$, and serves to drive the first MOS transistor $M_5$.

The drain currents of the first and second MOS transistors $M_5$ and $M_6$ are thus varied by the amplified error voltage. Since the drain of the first MOS transistor Ms is connected to the emitter of the second bipolar transistor $Q_2$, the drain current of the MOS transistor $M_5$ will influence the emitter voltage of the bipolar transistor $Q_2$.

Fundamentally, the operation of the bipolar transistor circuit having a free collector in accordance with the preferred embodiment of the present invention operates using the negative feedback loop made up of the transconductor 1, the first MOS transistor $M_5$ and the second bipolar transistor $Q_2$.

If the gain of this feedback loop is large, the voltages applied to the input terminals of the transconductor 1 by the feedback loop will be nearly identical. This means that the emitter voltages of the bipolar transistors $Q_1$ and $Q_2$ will likewise be nearly identical.

Because the terminal voltages of the first and second transistors $Q_1$ and $Q_2$ are the same, the emitter current of the first bipolar transistor $Q_1$ is the same as the emitter current of the second bipolar transistor $Q_2$. Also, the emitter current flows through the drain of the first MOS transistor $M_5$ without any loss and flows equally to the drain of the second MOS transistor $M_6$ because of the mirror relation resulting from the configuration of the first and second MOS transistors $M_5$ and $M_6$.

As a result of this operation, the transistor circuit shown in FIG. 5 operates like a general bipolar transistor. If the sizes of the first and second MOS transistors $M_5$ and $M_6$ are identical and the channel length modulation effect is ignored, current at the emitter E of the whole bipolar transistor will flow to the collector C as if the whole circuit were simply a single bipolar transistor.

The current gain ($H_{FE}$) of the whole bipolar transistor circuit can be expressed as follows:

$$H_{FE} = \frac{I_c}{I_b} = \frac{I_e}{I_b} = \frac{I_{ev}}{2I_{bv}} = \frac{1}{2H_{FEv}}$$

where $I_{ev}$, $I_{bv}$ and $H_{FEv}$ are the emitter current, base current, and current gain respectively of the transistors $Q_1$ and $Q_2$.

In additional embodiments of the current invention, the first and second NMOS transistors $M_5$ and $M_6$ can be connected in cascade by adding other NMOS transistors so as to increase the output impedance in the bipolar transistor circuit.

Figure 7:
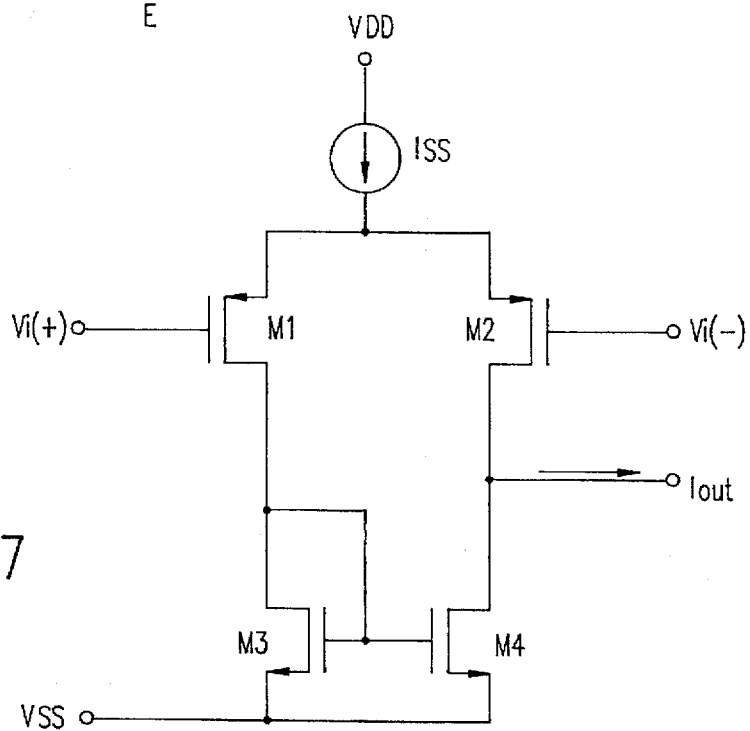
FIG. 7 is a detailed circuit diagram of the transconductor shown in FIG. 5.

FIG. 7 shows a detailed circuit diagram of the transconductor 1. As shown in FIG. 7, the transconductor 1 comprises first and second p-type MOS (PMOS) transistors $M_1$ and $M_2$ and first and second NMOS transistors $M_3$ and $M_4$. The first and second PMOS transistors $M_1$ and $M_2$ have a common source connected to a current source $I_{SS}$ supplied with the voltage $V_{DD}$ in serial. The first PMOS transistor $M_1$ has its gate supplied with input voltage Vi(+). The second PMOS transistor $M_2$ has its gate supplied with the input voltages $V_i(-)$. The first NMOS transistor $M_3$ has its gate and drain coupled and connected to the drain of the first PMOS transistor $M_1$, and its source supplied with the voltage $V_{SS}$. The second NMOS transistor $M_4$ has its drain connected to the drain of the second PMOS transistor $M_2$, its gate connected to the gate of the first NMOS transistor $M_3$, and its source supplied with the voltage $V_{SS}$.

In the transconductor 1, the output current $I_{out}$ is generated in the connection point of the second PMOS transistor $M_2$ and second the NMOS transistor $M_4$. The PMOS transistors $M_1$ and $M_2$ together comprise a differential pair and the NMOS transistor $M_3$ and $M_4$ together form an active load.

The first and second PMOS transistors $M_1$ and $M_2$ each generate a drain current corresponding to their gate voltage, and the drain current value of the first NMOS transistor $M_3$ corresponds to that of the first PMOS transistor $M_1$. Furthermore, the drain current of the first NMOS transistor $M_3$ is the same as the drain current of the NMOS transistor $M_4$ because of the mirror relation of the first and second NMOS transistors $M_3$ and $M_4$.

Accordingly, the output current $I_{out}$ is generated by the difference of the drain currents of the first and second PMOS transistors $M_1$ and $M_2$. The output current $I_{out}$ is converted to a voltage $V_{out}$ by output resistances of the second PMOS transistor $M_2$ and the first MOS transistor $M_5$. This converted voltage $V_{out}$ is the voltage applied to the gate of the first MOS transistor $M_5$.

When the transconductor 1 shown in FIG. 5 has the configuration shown in FIG. 7, the gain of the negative feedback loop can be expressed as follows:

$$Av = \frac{gm_1 \cdot gm_5}{(go_2 + go_4)gm_{Q2}}$$

where $gm_1$ and $gm_5$ are self transconductances of the first PMOS transistor $M_1$ and the first MOS transistor $M_5$ respectively, $gm_{Q2}$ is self transconductance of the second bipolar transistor $Q_2$, and $go_2$ and $go_4$ are the output transconductances of the second PMOS transistor $M_2$ and the second NMOS transistor $M_4$ respectively.

The loop gain can be increased by adjusting the bias currents of either of the bipolar transistors and the W/L (width over length) of the transistors $M_1$, $M_2$, $M_4$, and $M_5$.

Figure 8:
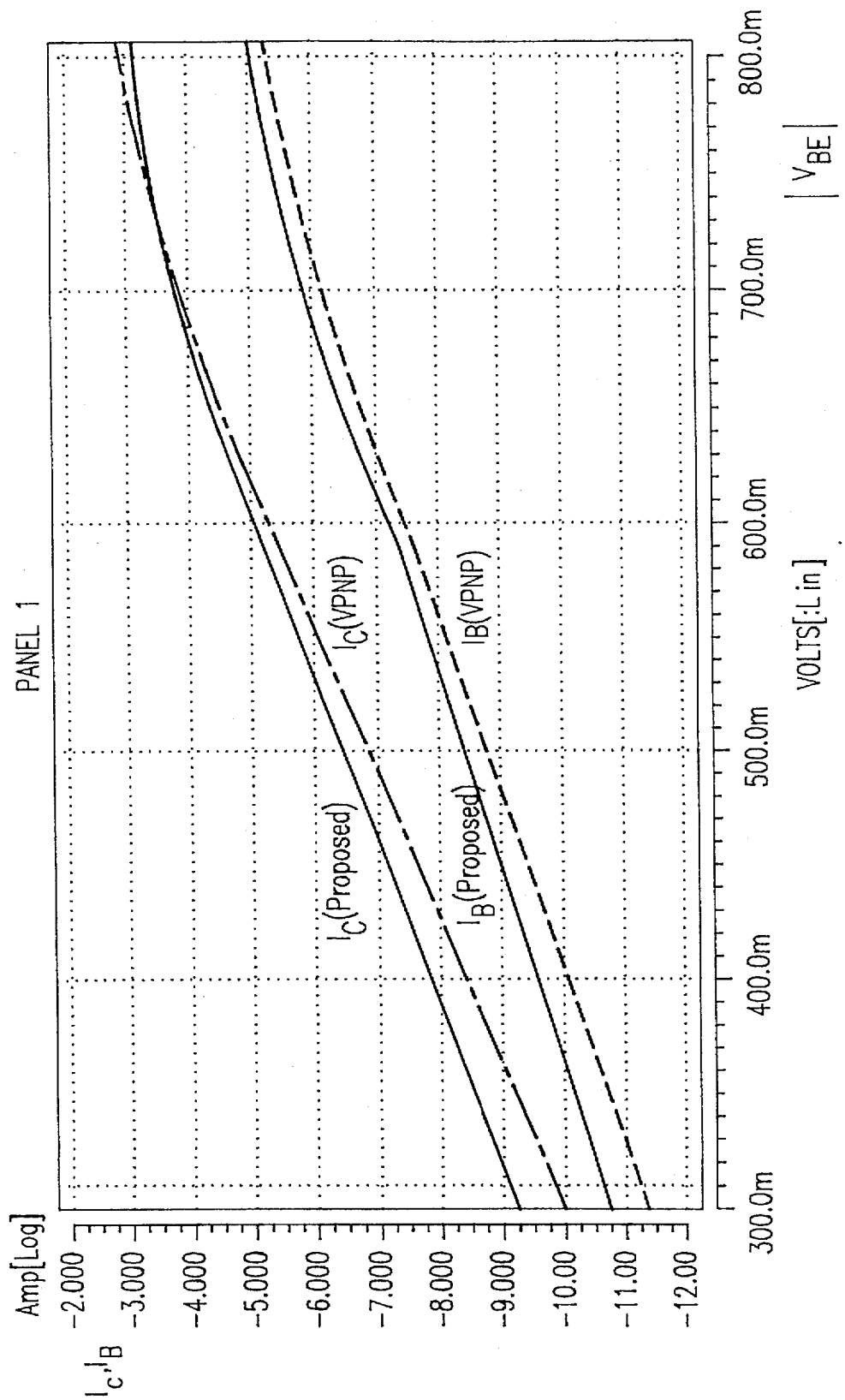
FIG. 8 is a graph comparing the electrical characteristics of the circuit of the present invention and a conventional circuit.

FIG. 8 is a graph showing the Spice simulation results, the collector and base current as a function of the base-to-emitter voltage, for both the bipolar transistor circuit with a free collector of the present invention and a conventional vertical bipolar transistor circuit. As shown in FIG. 8, the collector current of the proposed circuit appears linearly in the range from 1 nA to 100 µA, and it has an exponential functional characteristic by more than 5 decades.

Consequently, a bipolar transistor circuit with the free collector as described above can solve the problem of parasitic capacitance without significantly increasing the construction of the CMOS device.

The present invention is not limited to the above-described embodiments. Various changes and modifications may be effected by one having an ordinary skill in the art and remain within the scope of the invention, as defined by the appended claims.

What is claimed is:

1. A bipolar transistor circuit having a free collector comprising:

first and second bipolar transistors having common collectors and common bases, the common collectors being applied with a first voltage;

a transconductor, connected to emitters of the first and second bipolar transistors, for detecting and amplifying an error voltage between first and second emitter voltages received respectively from the emitters of the first and second bipolar transistors;

a first MOS transistor, for generating a drain current corresponding to a gate voltage received from the transconductor, the gate of the first MOS transistor being connected to an output of the transconductor, the drain of the first MOS transistor being connected to the emitter of the second bipolar transistor, and the source of the first MOS transistor being connected to a second voltage; and a second MOS transistor for generating a drain current proportional to the drain current of the first MOS transistor, the gate of the second transistor being connected to the output of the transconductor and the source of the second MOS transistor being connected to the second voltage.

2. A bipolar transistor circuit having a free collector as recited in claim 1, wherein the common base of the first and second bipolar transistors acts as a base of a transistor circuit, the emitter of the first bipolar transistor acts as an emitter of a transistor circuit, and the drain of the second MOS transistor acts as a collector of a transistor circuit.

3. A bipolar transistor circuit having a free collector as recited in claim 1, wherein the transconductor, the first MOS transistor and the second bipolar transistor form a negative feedback loop, and the error voltage of the transconductor decreases when a gain of the feedback loop increases.

4. A bipolar transistor circuit having a free collector as recited in claim 3, wherein the gain of the feedback loop is determined by bias currents of the bipolar transistors, a gain of the transconductor, and the ratio of channel width to channel length of the first MOS transistor.

5. A bipolar transistor circuit having a free collector as recited in claim 1, wherein the first and second MOS transistors are connected into a cascade by adding additional MOS transistors to increase an output impedance.

6. A bipolar transistor circuit having a free collector as recited in claim 1, wherein the first and second bipolar transistors are npn transistors.

7. A bipolar transistor circuit having a free collector as recited in claim 1, wherein the first and second MOS transistors are NMOS transistors.

8. A bipolar transistor circuit having a free collector of claim 1, wherein the transconductor comprises:

first and second PMOS transistors for generating a drain current corresponding to input voltages applied to the gates of the first and second PMOS transistors; and first and second NMOS transistors for generating a difference value between drain currents of the first and second PMOS transistors, Wherein the first and second NMOS transistors are connected in a mirror relationship with the first and second PMOS transistors.

9. A bipolar transistor circuit having a free collector as recited in claim 7, wherein an output current of the transconductor is converted to a voltage by an output resistor.

* * * * *